United States Patent
Akiba et al.

(10) Patent No.: US 8,546,911 B2
(45) Date of Patent: Oct. 1, 2013

(54) HIGH FREQUENCY DEVICE

(75) Inventors: Akira Akiba, Kanagawa (JP); Shun Mitarai, Kanagawa (JP); Koichi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 258 days.

(21) Appl. No.: 12/847,182

(22) Filed: Jul. 30, 2010

(65) Prior Publication Data

US 2011/0031583 A1 Feb. 10, 2011

(30) Foreign Application Priority Data

Aug. 7, 2009 (JP) ................................. 2009-184674

(51) Int. Cl.
*H01L 27/08* (2006.01)

(52) U.S. Cl.
USPC .................................. 257/531; 257/E27.018

(58) Field of Classification Search
CPC ...... H01L 23/5227; H01L 28/10; H01L 27/08
USPC ................ 251/531, 533, E27.018; 257/531, 257/533, E27.018
See application file for complete search history.

(56) References Cited

U.S. PATENT DOCUMENTS

| 4,959,705 | A  | * | 9/1990 | Lemnios et al. | ............... | 257/532 |
|---|---|---|---|---|---|---|
| 2003/0201851 | A1 | * | 10/2003 | Yoshida et al. | ............... | 333/246 |
| 2009/0134489 | A1 |   | 5/2009 | Chiozzi |   |   |
| 2011/0032685 | A1 |   | 2/2011 | Akiba et al. |   |   |

FOREIGN PATENT DOCUMENTS

| EP | 2 043 150 | 4/2009 |
|---|---|---|
| JP | 2002-016408 | 1/2002 |
| JP | 2003-297924 | 10/2003 |
| JP | 2007-220874 | 8/2007 |
| JP | 2008-42904 | 2/2008 |

OTHER PUBLICATIONS

Pajot et al., "Carrier removal in n+ GaAs:Si by proton implantation. A spectroscopic study", 1988, Mat. Res. Soc. Symp. Proc., vol. 104, pp. 345-348, Nov. 1988.*
T. Kaneko et al.; AlN HTCC Super Miniaturized Millimeterwave Transceiver MCMs, the Novel Structure for the High Reliability, the High Performance and the Mass Productivity; Microwave Symposium Digest; 1999.
European Communication Pursuant to Article 94(3) EPC dated Mar. 2, 2012 in connection with counterpart EP Application No. 10 008 048.0.

* cited by examiner

*Primary Examiner* — A. Sefer
*Assistant Examiner* — Nikolay Yushin
(74) *Attorney, Agent, or Firm* — Dentons US LLP

(57) ABSTRACT

A small high frequency device that is able to inhibit generation of an eddy current and a parasitic capacity and shows superior high frequency characteristics is provided. The high frequency device includes: a substrate having a depression; a dielectric layer over the substrate; and a plurality of electronic devices which are provided in the dielectric layer or on the dielectric layer, and at least one of which is opposed to the depression.

12 Claims, 15 Drawing Sheets

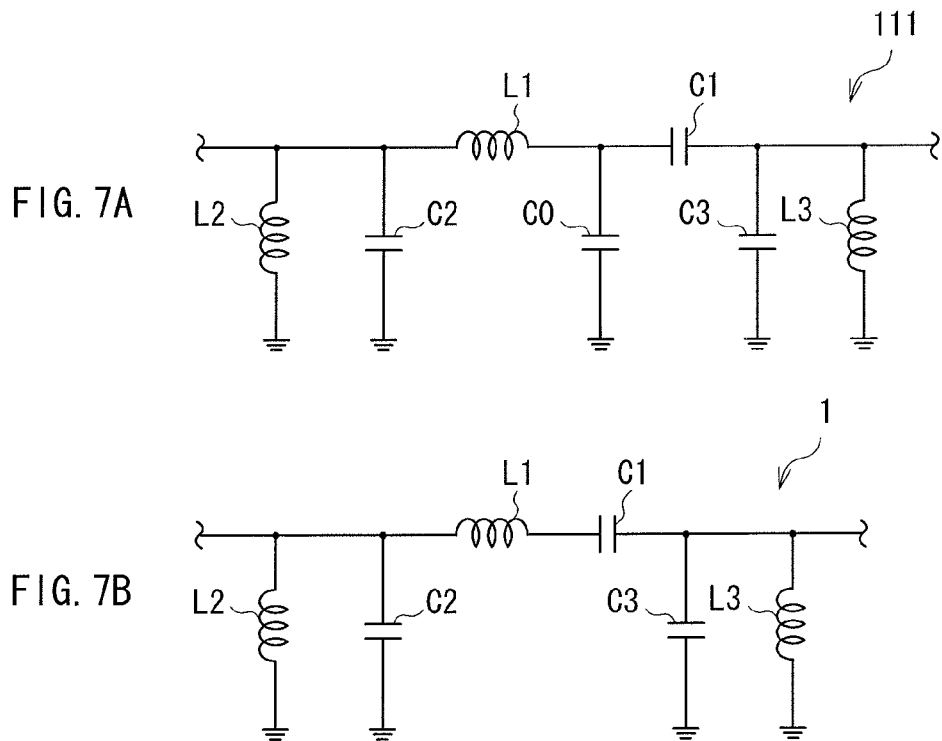
FIG. 7A
FIG. 7B
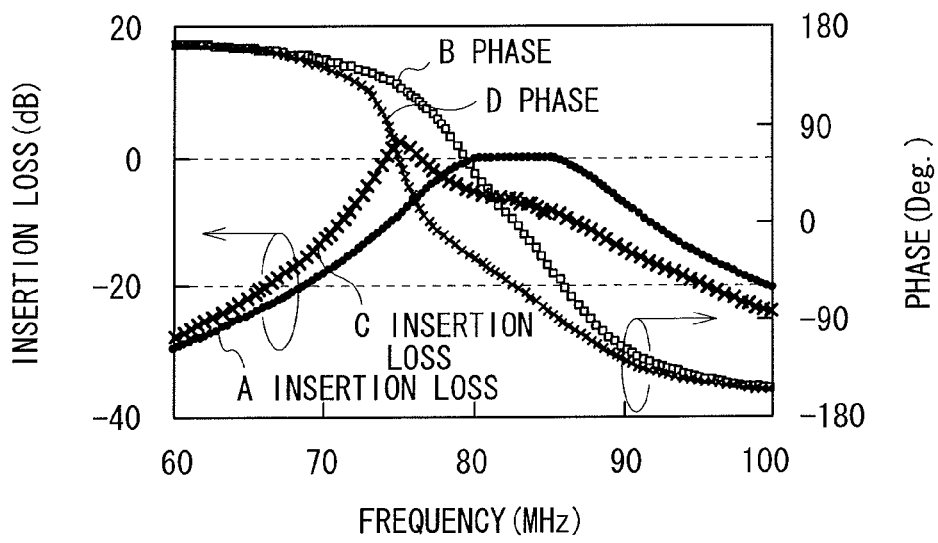
FIG. 8

HIGH FREQUENCY DEVICE

BACKGROUND OF THE INVENTION

1. Field of the Invention

The present invention relates to a high frequency device used for MEMS (Micro Electro Mechanical Systems), and particularly to a high frequency device including a high frequency signal-use analog circuit such as a filter circuit.

2. Description of the Related Art

As an element of a circuit for transmitting and receiving a radio wave of a television, a radio broadcasting, and a wireless LAN, a bandpass filter and lowpass filter are an essential element, and are an important electronic component that largely affects quality of a transmission signal. Examples of representative products in this field include a ceramic filter (for example, Japanese Unexamined Patent Application Publication No. 2007-220874). As a ceramic filter, various products for every frequency band are provided. For example, a SAW (Surface Acoustic Wave) filter is provided in MHz band of a transmitting and receiving circuit of a television and a radio, and a laminated ceramic filter is provided in GHz band of a transmitting and receiving circuit of a wireless LAN and a mobile device.

Though the ceramic filter is a superior device for providing high filter characteristics, the ceramic filter has a disadvantage that the size thereof is large. In recent years, a mobile device such as a mobile phone, a mobile player, and a net PC (Personal Computer) includes function as a television, a radio, and a wireless LAN. Thus, a significantly small filter device with the inherent characteristics has been aspired. Technical innovation of the ceramic filter has progressed, and 0608 size chip type laminated ceramic filter has been commercialized. However, in designing a set equipment, a single digit smaller device has been necessitated.

In addition to the ceramic filter, a sophisticated small filter device has been developed. Example thereof include a filter device formed on a silicon substrate. Along with currently improved high frequency characteristics of a CMOS (Complementary metal oxide semiconductor) circuit, such a filter device formed on the silicon substrate particularly attracts attention. If a desired filter circuit is able to be formed by the CMOS process on the silicon substrate, a combination circuit with other CMOS circuit is enabled, and accordingly a single digit or more smaller circuit than the ceramic filter is able to be realized.

As such a filter device, a high frequency filter circuit has been developed (for example, Japanese Unexamined Patent Application Publication No. 2003-297924). The high frequency filter circuit is provided as part of the high frequency transmission line provided on the surface of a silicon substrate. A signal line, a dielectric thin film formed under the signal line, and the silicon substrate constitute a capacitive device based on a planar pattern, an inductive device, and a resistive device.

SUMMARY OF THE INVENTION

However, in the filter device on the silicon substrate exemplified above, there has been a disadvantage that the performance thereof is slightly inferior to that of the same frequency band ceramic filter for the following reason. Silicon has a smaller specific resistance value than that of a ceramic material. Thus, due to an eddy current generated in the substrate or an unnecessary parasitic capacity between the signal line and the substrate or between signal lines, signal loss is generated. Examples of measures taken for the eddy current and the parasitic capacity include a method of decreasing interference with the silicon substrate by arranging a wiring pattern on a thickly layered insulating film, or a method of arranging each wiring with a large distance in between. However, the foregoing methods lead to increased device size, which may ruin the characteristics of the silicon filter. Such a disadvantage exists not only in the filter circuit, but also in a high frequency analog circuit including an inductive device and a capacitive device in common.

In view of the foregoing disadvantage, in the invention, it is desirable to provide a small high frequency device that is able to inhibit generation of an eddy current and a parasitic capacity and shows superior high frequency characteristics.

According to an embodiment of the invention, there is provided a high frequency device including a substrate having a depression; a dielectric layer over the substrate; and a plurality of electronic devices which are provided in the dielectric layer or on the dielectric layer, and at least one of which is opposed to the depression. It is only necessary to provide at least part of the electronic devices opposed to the depression on the depression. "Depression" is formed by selectively removing the substrate. Examples of the depression include a depression penetrating from the front face through the rear face of the substrate (penetration structure), a depression obtained by removing part of the substrate in the thickness direction (in particular, a portion on the device side) (hollow structure), and a depression obtained by removing the substrate with the use of a certain pattern such as a mesh. The number of "depressions" is not limited to one, but a plurality of depressions may be provided. Further, the number of devices opposed to one depression is not limited to one, but a plurality of devices may be opposed to one depression.

In the high frequency device, the depression exists in the position opposed to a specific electronic device (in particular, an inductive device) of the substrate. In such a position, the substrate does not exist, or the hollow structure is provided. Thus, generation of a parasitic capacity between the substrate and the device and generation of an eddy current are able to be inhibited.

According to the high frequency device of the embodiment of the invention, the depression is provided in the position opposed to the specific electronic device (in particular, the inductive device) of the substrate. Thus, generation of the parasitic capacity between the substrate and the device and generation of the eddy current are able to be inhibited. Accordingly, characteristics of an electronic circuit, in particular, characteristics of a filter circuit are able to be improved.

Other and further objects, features and advantages of the invention will appear more fully from the following description.

BRIEF DESCRIPTION OF THE DRAWINGS

FIG. 7A and FIG. 7B are equivalent circuit diagrams of the high frequency device illustrated in FIG. 1 and a comparative example.

FIG. 8 is a diagram illustrating frequency characteristics of the high frequency device illustrated in FIG. 1 and a comparative example.

DETAILED DESCRIPTION OF THE PREFERRED EMBODIMENTS

Figure 1:
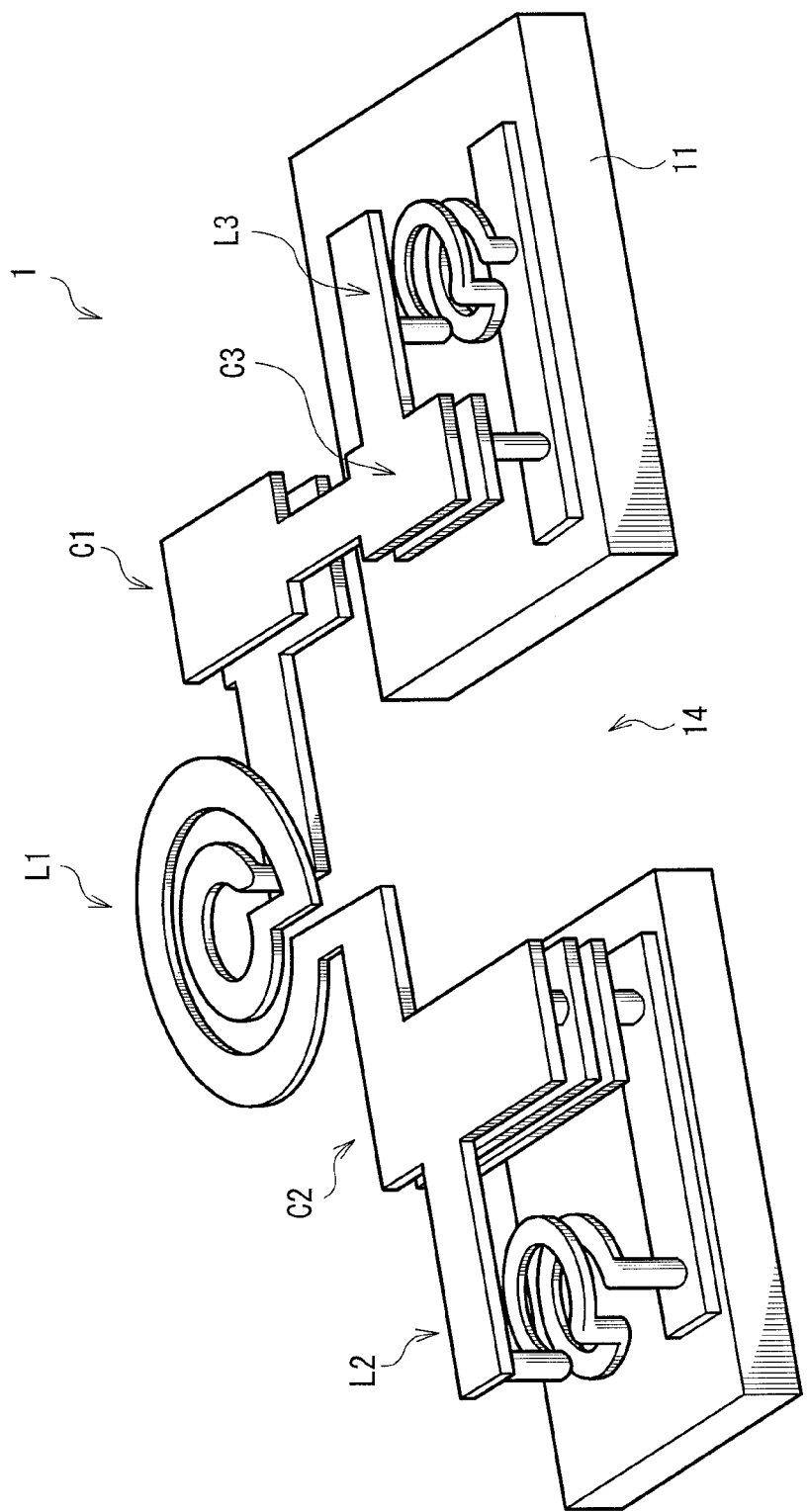
FIG. 1 is a perspective view of a main body section of a high frequency device according to a first embodiment of the invention.
Figure 2:
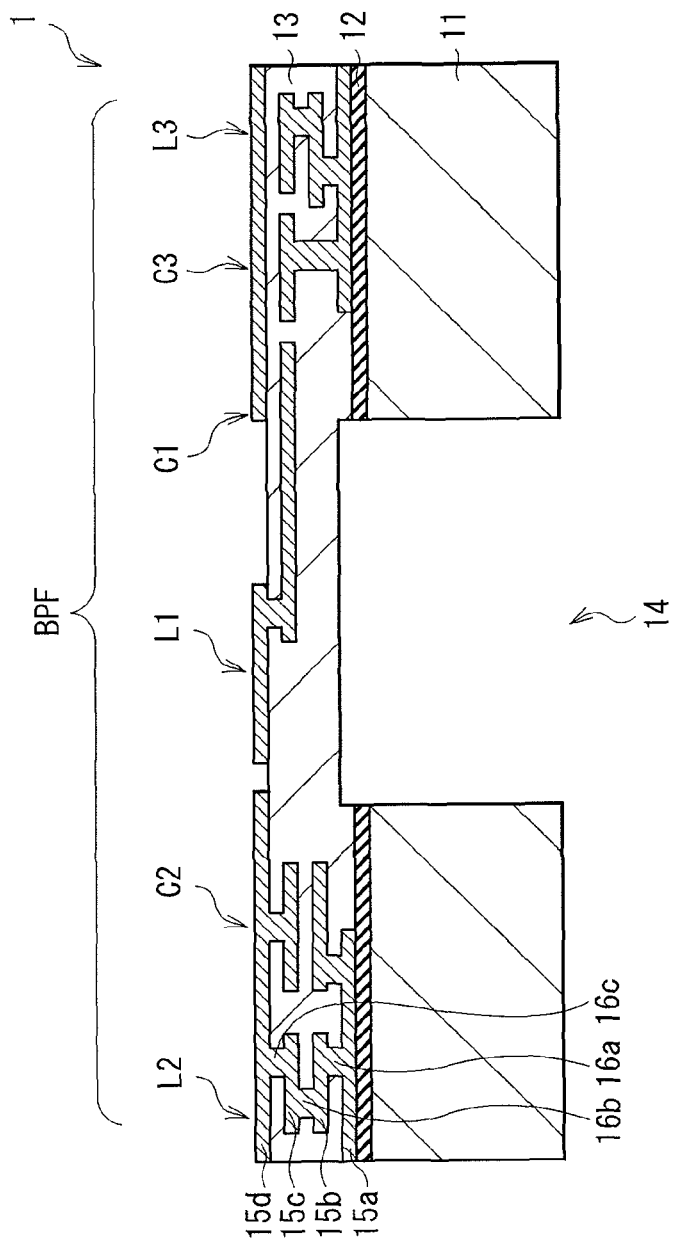
FIG. 2 is a cross sectional structural view of the high frequency device.

Embodiments of the invention will be hereinafter described with reference to the drawings in the following order:
1. First embodiment
(1) Whole structure
(2) Manufacturing method
2. Second embodiment
High frequency device having a plurality of depressions
3. Third embodiment
High frequency device in which part of a substrate is left in a depression
4. Fourth embodiment
High frequency device having a highpass filter as an analog circuit
5. Fifth embodiment
High frequency device having a lowpass filter as an analog circuit
6. Sixth embodiment
High frequency device having an impedance matching circuit as an analog circuit
1. First Embodiment
(1) Whole Structure FIG. 1 illustrates a device main body of a high frequency device 1 according to a first embodiment of the invention. FIG. 2 illustrates a whole cross sectional structure of the high frequency device 1. The high frequency device 1 includes a bandpass filter BPF as an analog circuit in a dielectric layer 13 over a substrate 11.

Figure 3:
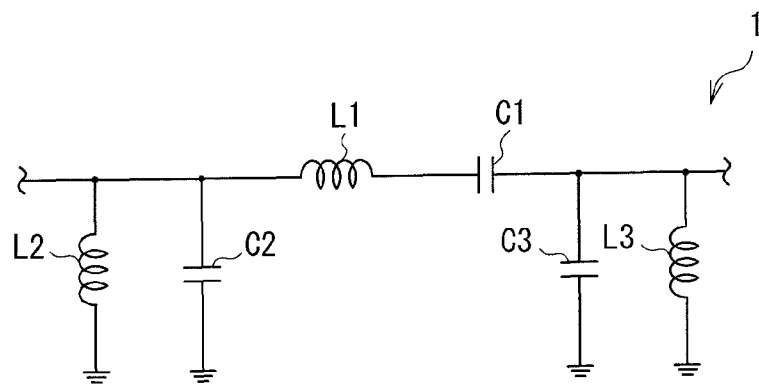
FIG. 3 is an equivalent circuit diagram of the high frequency device.

The bandpass filter BPF is, for example, composed of six LC devices. That is, as illustrated in the equivalent circuit of FIG. 3, the BPF is composed of a first inductive device L1 and a first capacitive device C1 connected in series with a signal line, a second inductive device L2 and a second capacitive device C2 connected from the input terminal of such a series circuit to ground level, and a third inductive device L3 and a third capacitive device C3 connected from the output terminal of such a series circuit to the ground level.

As the substrate 11, for example, a silicon substrate having a thickness from 50 to 400 μm both inclusive is used. A material of the substrate 11 is not limited thereto, but other semiconductor material or a dielectric material may be used. Examples of other semiconductor materials include SiGe and GaAs. Examples of dielectric materials include ceramic, glass (for example, Pyrex, SD2, and quartz) and a resin (FR4 and BT resin). Further, FR-4 as the general name (glass epoxy) or the like used as a mount substrate may be used.

In this embodiment, a depression 14 penetrating the substrate 11 is provide in the position opposed to the first inductive device L1 of the substrate 11. In this case, the depression 14 is provided in the substrate 11, an insulating film 12, and part of the dielectric layer 13. However, it is enough that the depression 14 is provided at least in the substrate 11. The planar pattern of the depression 14 is, for example, circular or rectangular, but is not limited thereto. The planar pattern of the depression 14 is determined by the shape and the size of the device (first inductive device L1) oppositely arranged.

The insulating film 12 is provided between the substrate 11 and the dielectric layer 13. In the insulating film 12, for example, a silicon nitride film (SiN) having a thickness from 0.01 to 0.3 μm both inclusive is formed on a silicon oxide film ($SiO_2$) having a thickness from 0.01 to 4 μm both inclusive. As will be described later, the insulting film 12 functions as an etching stopper layer in providing the depression 14 in the substrate 11. The insulating film 12 is not indispensable as a structure for attaining membrane device performance. In this case, the first dielectric device L1 is formed in the position opposed to the depression 14. However, one or a plurality of other devices (the second dielectric device L2, the third dielectric device L3, the first capacitive device C1, the second capacitive device C2, or the third capacitive device C3) may be formed in such a position. However, in terms of inhibiting signal loss described later, the depression 14 is desirably located in the position opposed to at least the dielectric device.

The dielectric layer 13 is formed from a low dielectric permittivity material with small high frequency signal loss such as benzocyclobutene (BCB). The thickness of the dielectric layer 13 is determined by both electric characteristics and mechanical strength, and is, for example, from 1 to 20 μm both inclusive. As the dielectric layer 13, other material among the generally used dielectric materials is able to be used, as long as such a material has small high frequency signal loss and has a strength to the degree with which a cross-linked structure is able to be retained even if the depression 14 is provided in the substrate 11 as described above. Specifically, in addition to an organic material such as polyimide (PI), parylene, and diamond-like carbon (DLC), an inorganic material such as $SiO_2$ is able to be used.

A multilayer structure wiring layer is provided in and on the dielectric layer 13. Each device constituting the bandpass filter BPF is composed by a wiring layer formed on the dielectric layer 13, or a combination of a multilayer wiring layer and an interlayer penetrating wiring layer (via contact) buried in the dielectric layer 13. These wiring layers are formed from a conductive material, for example, a metal material such as Al (aluminum) and AlCu (aluminum copper).

A description will be specifically given based on the input side. The second inductive device L2 is composed of a first wiring layer 15a to a third wiring layer 15c in the dielectric layer 13, a wiring layer 15d on the dielectric layer 13, and via contacts 16a to 16c connecting these wiring layers. The second capacitive device C2 is composed of the second wiring layer 15b and the third wiring layer 15c with the dielectric layer 13 in between. The first wiring layer 15a is connected to the second wiring layer 15b through the via contact 16a, and the wiring layer 15d is connected to the third wiring layer 15c through the via contact 16c. The first inductive device L1 is composed of the wiring layer 15a having a coil pattern on the dielectric layer 13. The first capacitive device C1 and the third capacitive device C3 are composed of the third wiring layer 15c and the fourth wiring layer 15d with the dielectric layer 13 in between. The third inductive device L3 is composed of the first wiring layer 15a to the third wiring layer 15c in the dielectric layer 13, the wiring layer 15d on the dielectric layer 13, and the via contacts 16a to 16c connecting these wiring layers.

The high frequency device 1 is able to be manufactured, for example, by the method illustrated in FIGS. 4A to 4C and FIGS. 5A and 5B.

(2) Manufacturing Method

Figure 4A:
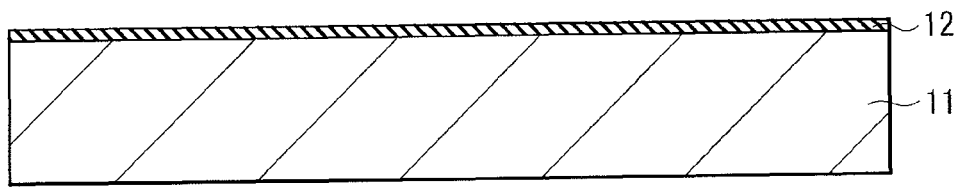
FIGS. 4A to 4C are cross sectional views illustrating an example of a method of manufacturing the high frequency device illustrated in FIG. 1.

First, as illustrated in FIG. 4A, the insulating layer 12 is formed on the silicon substrate (substrate 11). In this case, since the material of the substrate 11 is silicon, as the insulating layer 12, a laminated film including a silicon oxide film ($SiO_2$) and a silicon nitride film (SiN) having etching selectivity with silicon is formed. Specifically, for example, the silicon substrate having a thickness of 0.6 mm is heated at 1000 deg C. to form the $SiO_2$ film having a thickness of 3 μm by thermal oxidation under water vapor atmosphere. Next, the $SiO_2$ film on one side (rear face) of the substrate 11 is polished and removed to obtain the thickness of the substrate 11 of, for example, 0.5 mm. Next, on the $SiO_2$ film on the front face of the substrate 11, the SiN film having a thickness from 0.1 to 0.3 μm both inclusive is formed by, for example, CVD (Chemical Vapor Deposition) method.

Figure 4B:
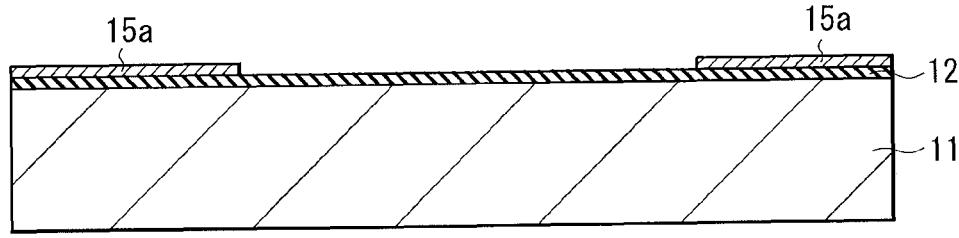
Figure 4C:
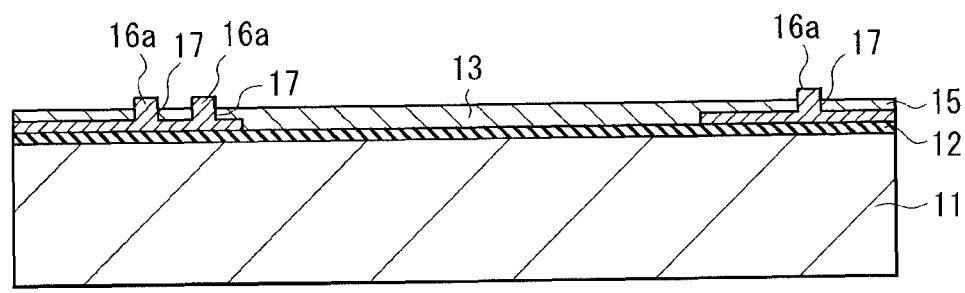

Subsequently, as illustrated in FIG. 4B, for example, Al as a wiring material is deposited on the insulating layer 12. The resultant is formed into a given shape by, for example dry etching, and thereby the wiring layer 15a (first wiring) as a first layer is formed. Subsequently, as illustrated in FIG. 4C, the dielectric film 13 is formed on the insulating layer 12 and the wiring layer 15a, and the via contact 16a is formed in the dielectric film 13. Specifically, the dielectric film 13 is formed by spin coat method by using BCB as a low-dielectric-permittivity material, a through hole (via hole) 17 reaching the wiring layer 15a as a lower layer is formed in the dielectric layer 13. After that, the through hole 17 is filled with Al to form the via contact 16a.

Figure 5A:
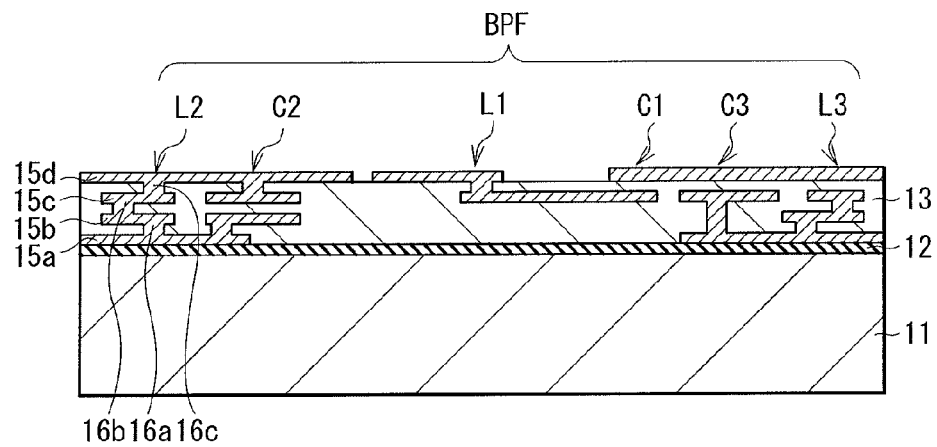
FIGS. 5A and 5B are cross sectional views illustrating steps following FIGS. 4A to 4C.

Next, by using a similar method, as illustrated in FIG. 5A, the wiring layer 15b (second wiring layer) as a second layer, the dielectric layer 13, the via contact 16b, and the wiring layer 15c (third wiring layer) as a third layer are formed. Further, the dielectric layer 13, the via contact 16c, and the wiring layer 15d (fourth wiring layer) as a fourth layer are formed.

Figure 5B:
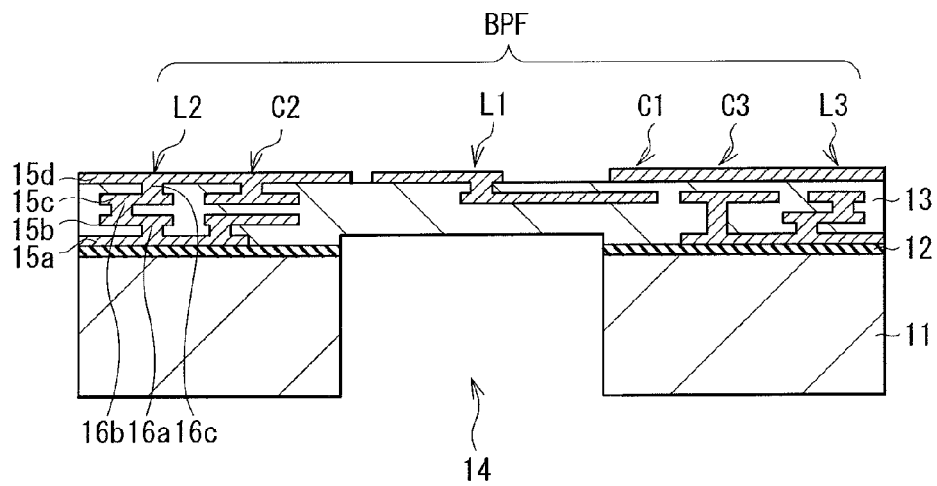

Finally, as illustrated in FIG. 5B, the resultant is selectively removed from the rear face side of the substrate 11, and thereby the depression 14 is formed. Specifically, for example, a hard mask is formed on the rear face of the substrate 11. After that, the substrate 11 is etched by, for example, DRIE (Deep Reactive Ion Etching) to form the depression 14 and obtain a desired membrane structure. As etching conditions, vertical process by SF6/C4H8 known as Bosch process or dry process by XeF2 is used. Further, wet process using tetramethylammonium hydroxide (TMAH) or potassium hydroxide (KOH) may be used. At this time, since the insulating layer 12 provided between the substrate 11 and the dielectric layer 13 works as an etching stopper layer, etching is stopped in the insulating layer 12. In the case where the thickness of the insulating layer 12 that is determined by wiring design other than the dielectric device L1 as a hollow device is thin, as illustrated in FIG. 5B, overetching may be generated.

In the high frequency device 1 of this embodiment, the depression 14 is provided particularly in the position opposed to the first inductive device L1 out of the LC devices composing the bandpass filter BPF of the substrate 11. Thus, signal loss by the substrate 11 directly under the first inductive device L1 is able to be inhibited, and the device characteristics are improved.

Figure 6A:
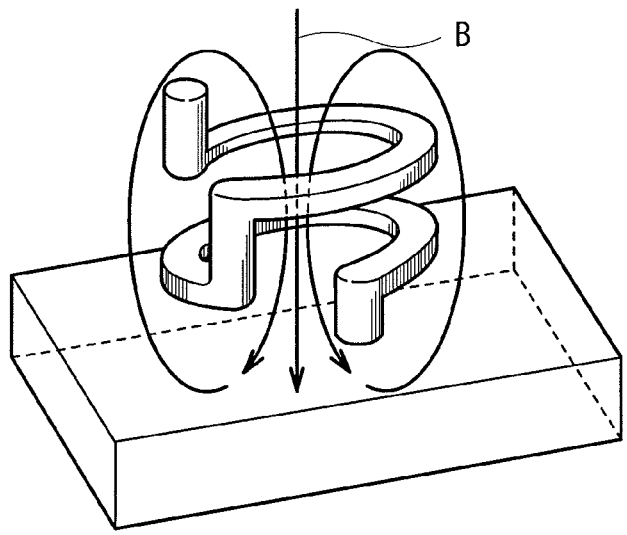
FIGS. 6A to 6C are schematic views for explaining effect of the high frequency device.
Figure 6B:
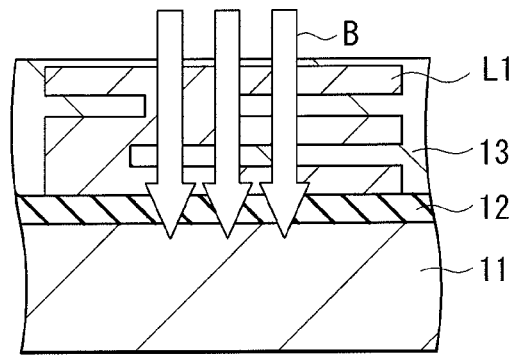
Figure 6C:
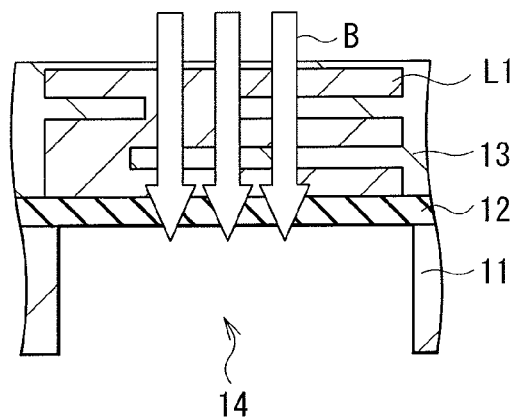

FIGS. 6A to 6C are given for explaining influence on the device characteristics by providing the depression 14. In the first inductive device L1 (inductor), flux B is generated by transmitting a high frequency signal (FIG. 6A). At this time, if the substrate 11 exists in a path of the flux B (the depression 14 does not exist in the substrate 11 as in the existing case), an eddy current is generated in the substrate 11, and loss is generated in the flux B (FIG. 6B). Thereby, a disadvantage that Q value of the inductor is lowered occurs. Meanwhile, in this embodiment, the depression 14 is provided in the substrate 11 in the position opposed to the first inductive device L1, and by just that much, flux loss by the eddy current in the substrate 11 is decreased. Thus, higher Q value is obtainable (FIG. 6C). FIGS. 6B and 6C illustrate a loss portion of the flux B based on difference of arrow length.

FIGS. 7A and 7B illustrate comparison between characteristics of the high frequency device 1 of this embodiment having an FM tuner-use BPS and characteristics of an existing device (comparative example). FIG. 7A is an equivalent circuit of the comparative example, and FIG. 7B is an equivalent circuit of this embodiment (refer to FIG. 3). The first inductive device L1 of a device 100 of the comparative example has a parasitic capacity C0 between the first inductive device L1 and the silicon substrate. Generation of the parasitic capacity C0 is not avoidable because of its structure, and thus the parasitic capacity C0 should be decreased as much as possible by devising layout. Even in the case of a μH or less inductor designed for a MHz band bandpass filter, it is necessary to assume about 0.1 pF parasitic capacity.

Meanwhile, in the high frequency device 1 of this embodiment, the depression 14 is provided particularly in the position opposed to the first dielectric device L1 out of the three inductor devices. Thus, generation of the parasitic capacity is able to be inhibited. By selectively removing the substrate 11 as a factor to generate the parasitic capacity as described above, the parasitic capacity size is able to be decreased down to the level ignorable as an equivalent circuit.

FIG. 8 illustrates frequency characteristics obtained by comparatively calculating the high frequency device 1 of this embodiment and a device 111 of a comparative example with the use of SPICE model. The horizontal axis indicates frequency (from 60 to 100 MHz including FM broadcasting band), and the vertical axis indicates insertion loss and phase. The insertion loss is shown in units of dB on the left vertical axis, and the phase is displayed in units of degree on the right vertical axis. In the measurement results (insertion loss C and phase D) of the comparative example (device 111), both the insertion loss C and the phase D are in the distorted shape. To realize an ideal shape by using the existing technology, it is necessary to use a high order filter, and in addition, to repeat tuning trial production of the component device and cut-and-try calculation. Thus, to realize an ideal shape, it is necessary that the device size is increased and design is made by increasing cost. Meanwhile, in the high frequency device 1 (insertion loss A and phase B) of this embodiment, both the insertion loss A and the phase B are in the smooth shape. Thus, ideal characteristics are able to be easily obtained without changing the device size or changing the circuit design.

As described above, in this embodiment, the depression 14 is provided in the substrate 11 in the position opposed to the first dielectric device L1 out of the six LC devices composing the bandpass filter BPF. Thus, signal loss due to a parasitic capacity and signal loss due to an eddy current are able to be concurrently decreased. Thus, the filter characteristics are able to be improved. Further, a low order filter, that is, a small filter is able to be realized, and desired filter characteristics are able to be realized in a short design time period.

Further, in this embodiment, the inductive devices L2 and L3 and the capacitive devices C1 to C3 respectively have the space structure in which the multilayer wiring and the via contact are combined. Thereby, the circuit size is able to be decreased.

A description will be hereinafter given of other embodiments. For the same elements as those of the first embodiment, the same referential symbols are affixed and the descriptions thereof will be omitted. In addition, for the corresponding elements, their referential symbols are obtained by adding 10, 20, 30, 40, or 50 to the referential symbols of the relevant elements of the first embodiment as appropriate for every embodiment.

Second Embodiment

Figure 9:
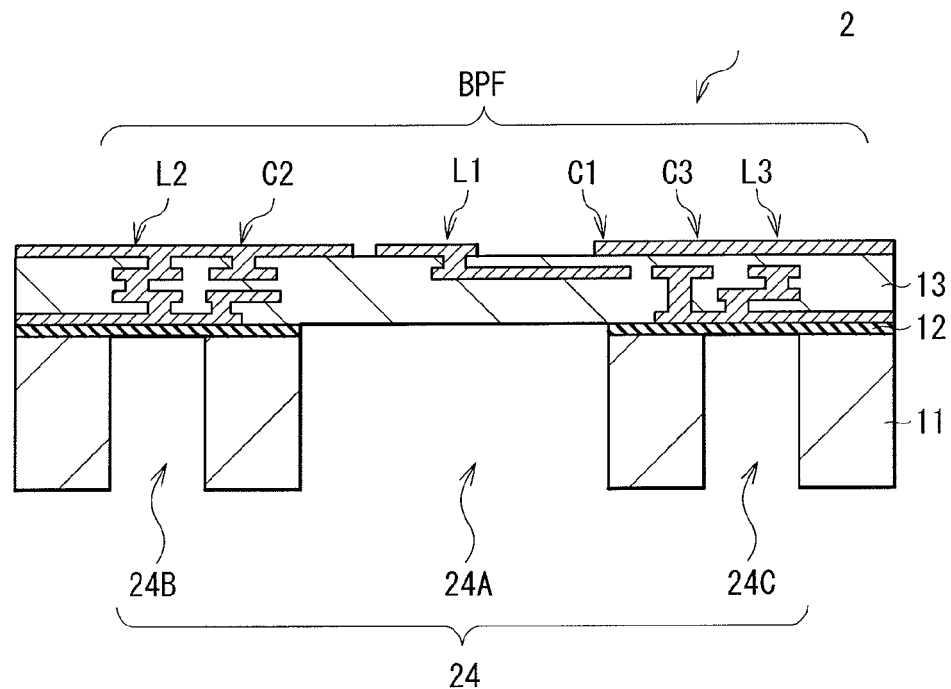
FIG. 9 is a cross sectional structural view of a high frequency device according to a second embodiment.

FIG. 9 illustrates a cross sectional structure of a high frequency device 2 according to a second embodiment of the invention. The high frequency device 2 also includes the bandpass filter BPF as a device as in the foregoing embodiment.

The high frequency device 2 has a plurality of depressions 24 (24A to 24C) in the substrate 11. That is, the depressions 24A, 24B, and 24C are respectively provided in each position opposed to the second dielectric device L2 and the third dielectric device L3 in addition to the first dielectric device L1. It is needless to say that the layout of the depressions 24 is not limited thereto, but a given number of depressions having a given size are able to be formed in a given position in etching step of the substrate 11.

Due to such a structure, in this embodiment, not only signal loss of the first dielectric device L1, but also signal loss of the second dielectric device L2 and signal loss of the third dielectric device L3 are able to be inhibited, leading to more effective result.

Third Embodiment

Figure 10:
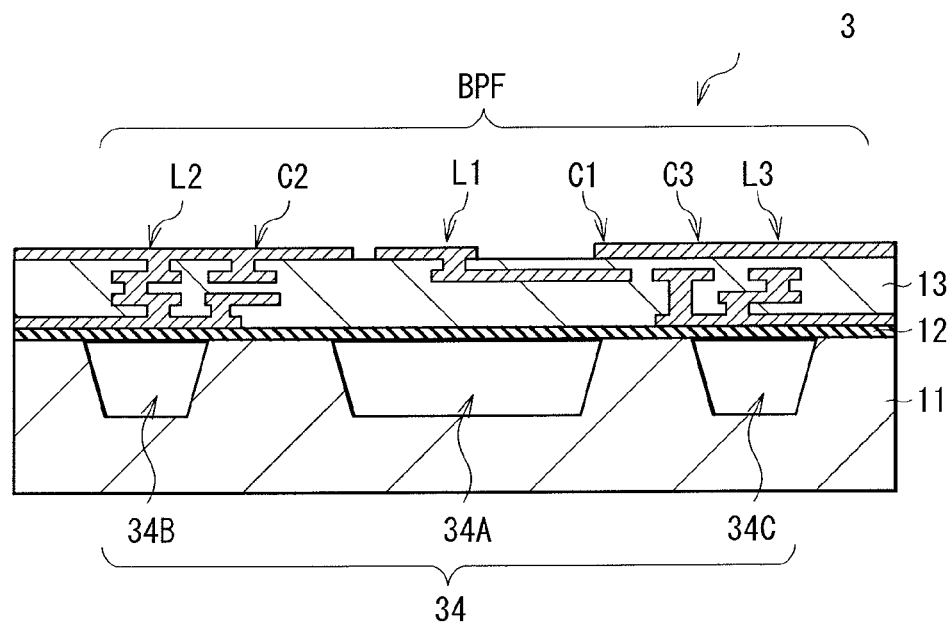
FIG. 10 is a cross sectional structural view of a high frequency device according to a third embodiment.

FIG. 10 illustrates a cross sectional structure of a high frequency device 3 according to a third embodiment of the invention. The high frequency device 3 also includes the bandpass filter BPF.

The high frequency device 3 has depressions 34 (34A, 34B, and 34C) in each position opposed to the first dielectric device L1, the second dielectric device L2 and the third dielectric device L3 of the substrate 11. Differently from the depressions 14 and 24 of the foregoing embodiments, the depressions 34A, 34B, and 34C do not penetrate the substrate 11, but have a hollow structure between the substrate 11 and the insulating film 12.

The effect of decreasing signal loss by the depression 14 described in FIGS. 6A to 6C is more increased as the gap between the substrate 11 and the wiring layer 15a as the lowermost layer of the device is larger. However, the effect is not increased without limit, but improvement of the characteristics is limited at a given size of the gap. Such a limitation size is determined by a projected area of the device formed in the position corresponding to the depression 14, the thickness of the metal layer and the like. Thus, in the process of the substrate 11 necessary for forming the depression 14, total removal (penetration structure) may not necessitated. As illustrated in FIG. 10, it is enough that a hollow structure at a certain distance from the wiring layer constituting the first dielectric device L1, the second dielectric device L2, and the third dielectric device L3 exists.

Figure 11A:
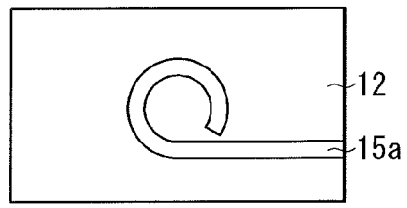
FIGS. 11A to 11D are plan views and cross sectional views illustrating an example of a method of manufacturing the high frequency device illustrated in FIG. 10.
Figure 11A:
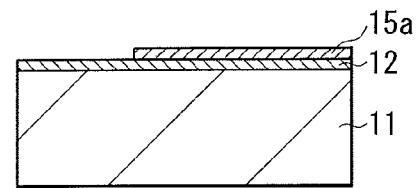
Figure 11B:
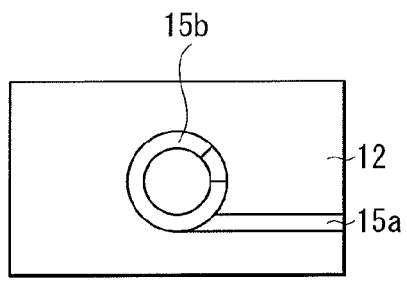
Figure 11B:
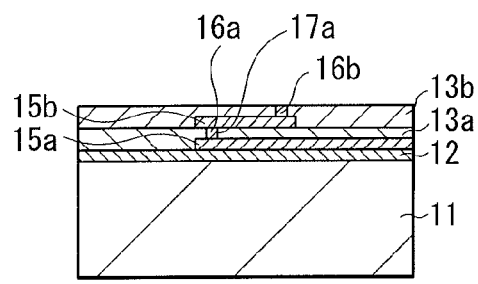
Figure 11C:
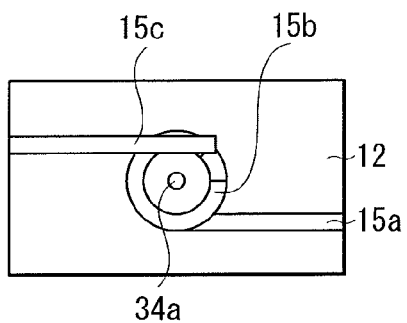
Figure 11C:
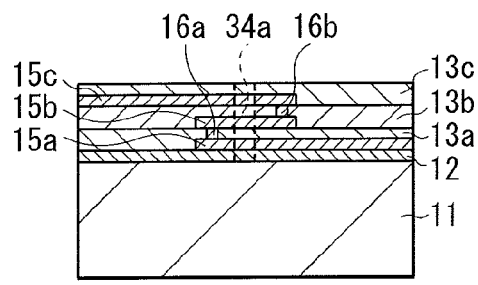
Figure 11D:
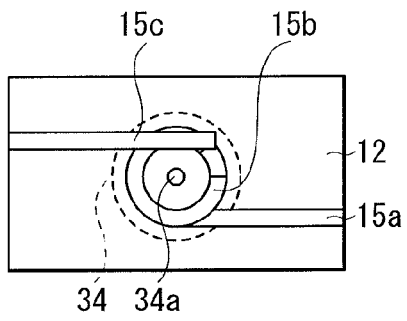
Figure 11D:
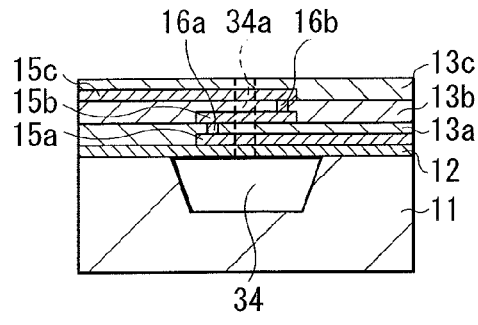

A description will be given of a method of forming such a hollow structure with reference to FIGS. 11A to 11D. First, as illustrated in FIG. 11A, the insulating layer 12 is formed on the silicon substrate (substrate 11) by thermal oxidation. On the insulating layer 12, for example, Al as a wiring material is deposited into a given shape, and thereby the wiring layer 15a as a first layer is formed. Next, as illustrated in FIG. 11B, a dielectric film 13a is formed to cover the insulating layer 12 and the wiring layer 15a, and a through hole 17a is formed in the dielectric film 13a. After that, the through hole 17a is filled with Al to form the via contact 16a. Subsequently, similar wiring process is performed on the dielectric film 13a, and the wiring layer 15b as a second layer, a dielectric film 13b, and the via contact 16b are formed. Next, as illustrated in FIG. 11C, after the wiring layer 15c as a third layer is formed on the dielectric layer 13b, the entire wiring is covered with a dielectric film 13c as a protective film. Subsequently, as illustrated in FIG. 11D, an etching hole 34a for passing an etchant used for processing the silicon substrate 11 is formed in the dielectric films 13a, 13b, and 13c by, for example, dry etching. Finally, the depression 34 is formed by etching the silicon substrate by zenon etcher through the etching hole 34a.

Fourth Embodiment

Figure 12:
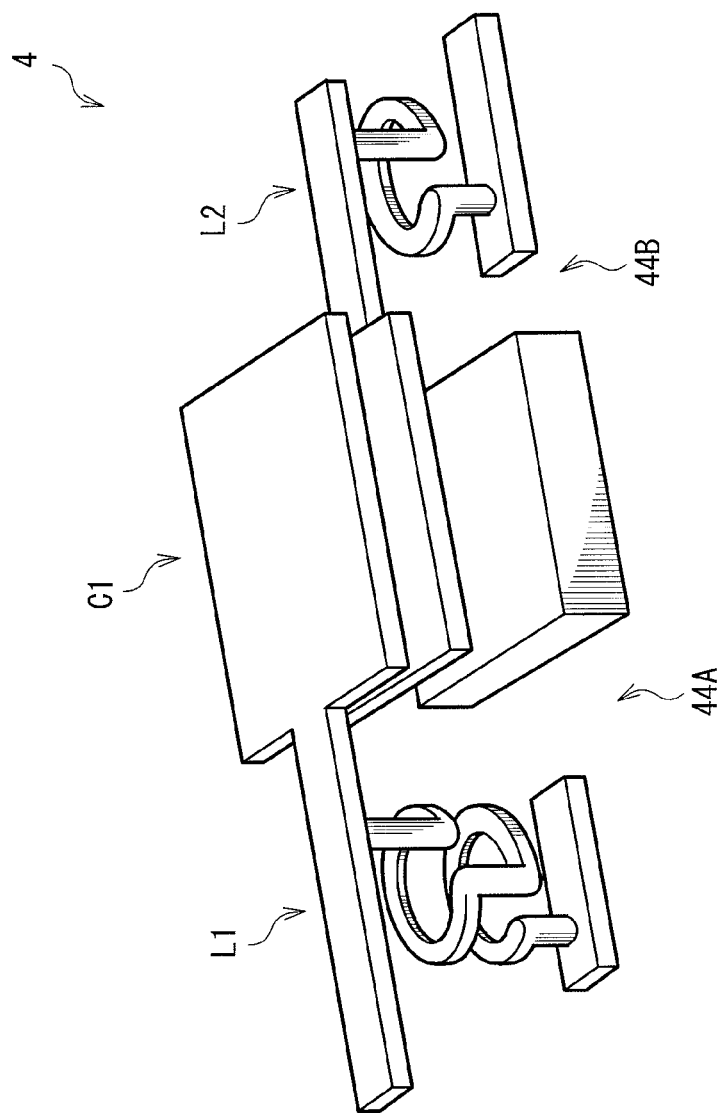
FIG. 12 is a perspective view of a main body section of a high frequency device according to a fourth embodiment of the invention.
Figure 13:
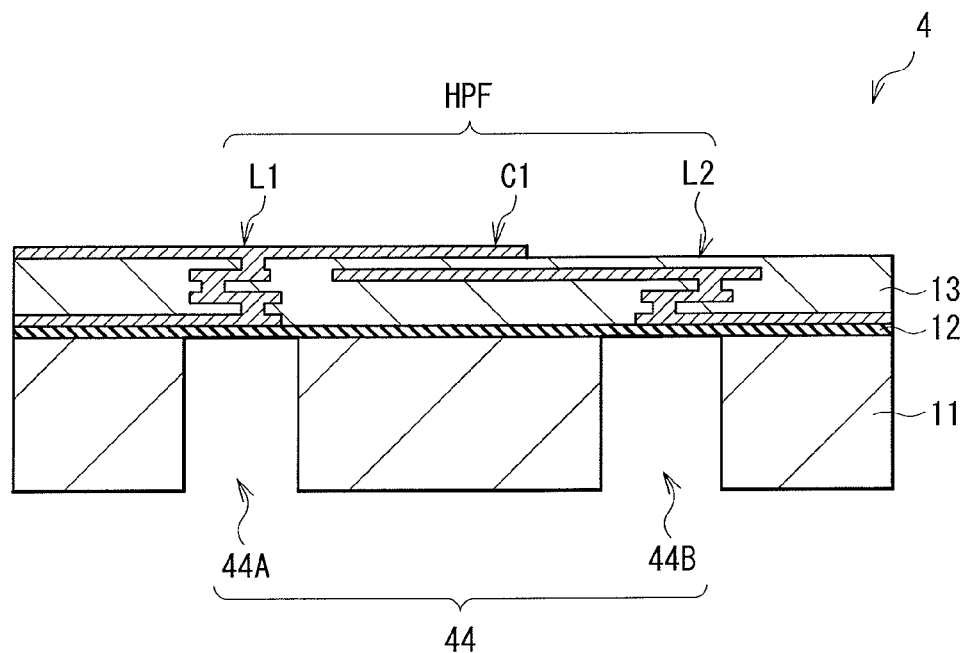
FIG. 13 is a cross sectional structural view of the high frequency device.
Figure 14:
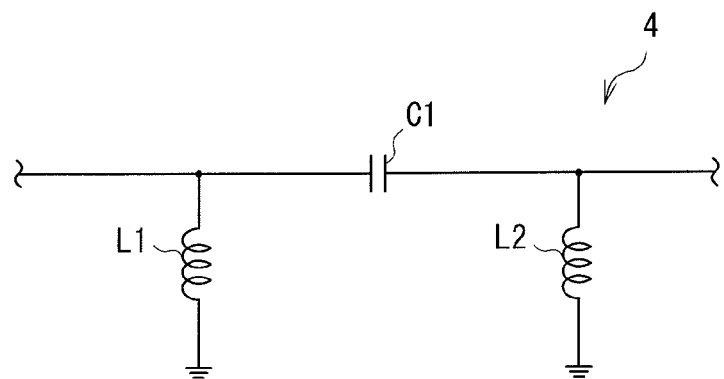
FIG. 14 is an equivalent circuit diagram of the high frequency device.

FIG. 12 illustrates a configuration of a main body section of a high frequency device 4 according to a fourth embodiment of the invention. FIG. 13 illustrates a cross sectional configuration of the entire high frequency device 4, and FIG. 14 illustrates the equivalent circuit thereof. The high frequency device 4 includes a highpass filter HPF as a device. The highpass filter HPF is composed of the first dielectric device L1 and the second inductive device L2 connected from a signal line to the ground level and the capacitive device C1 connected in series with the signal line between the first dielectric device L1 and the second inductive device L2. Specific structures of the first dielectric device L1 and the second inductive device L2 are similar to those of the first embodiment. The capacitive device C1 is composed of the wiring layers 15c and 15d with the dielectric layer 13 in between.

In the high frequency device 4, depressions 44A and 44B are provided in a position opposed to the first dielectric device L1 and the second inductive device L2. The action and the effect are similar to those of the foregoing embodiments. In this case, though the third order HPF as the minimum structure is used, the order is not limited. As filter characteristics, in accordance with, for example, needs of a suppression component shoulder and ripple shape, necessary order and size of each device composing the HPF are able to be arbitrarily selected.

Fifth Embodiment

Figure 15:
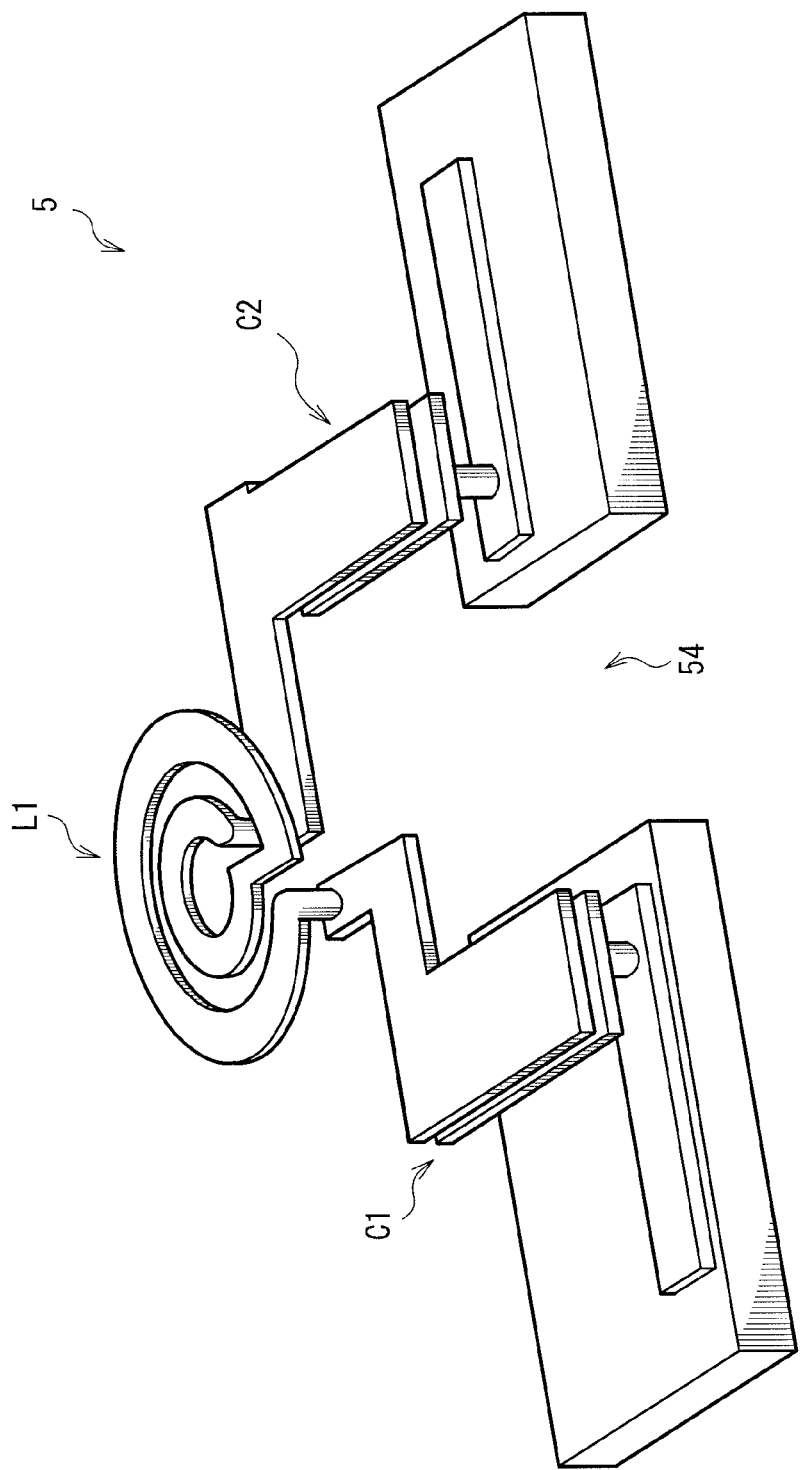
FIG. 15 is a perspective view of a main body section of a high frequency device according to a fifth embodiment of the invention.
Figure 16:
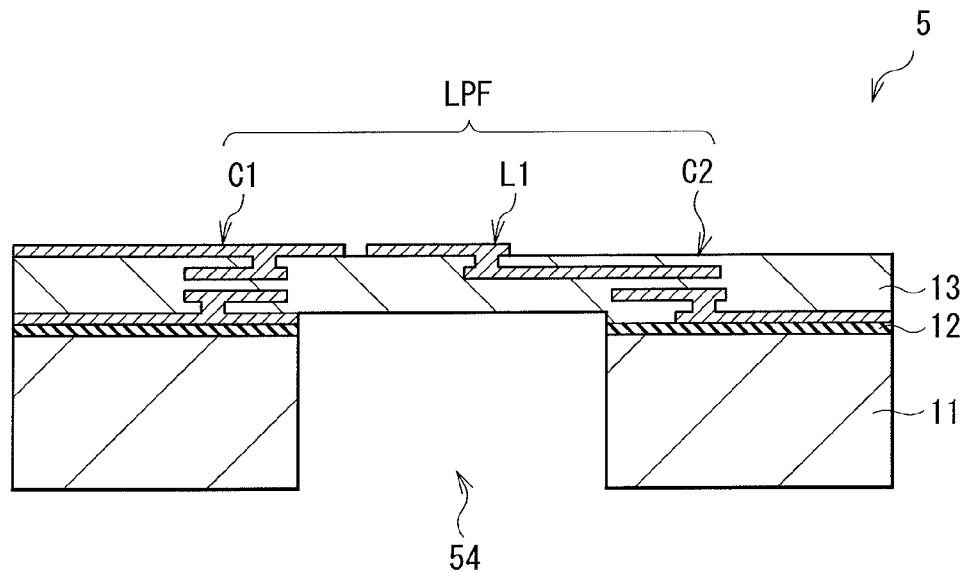
FIG. 16 is a cross sectional structural view of the high frequency device.
Figure 17:
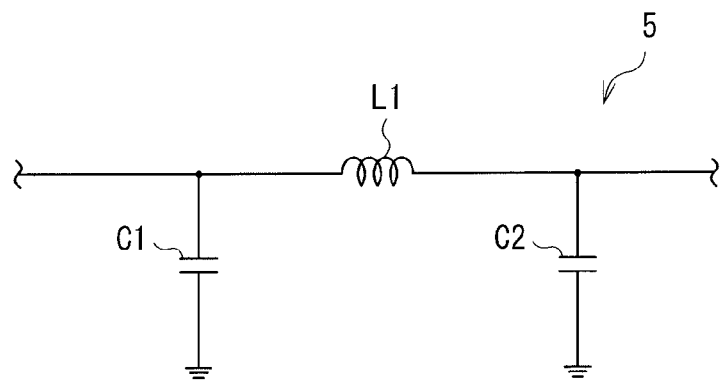
FIG. 17 is an equivalent circuit diagram of the high frequency device.

FIG. 15 illustrates a device main body of a high frequency device 5 according to a fifth embodiment of the invention. FIG. 16 illustrates a cross sectional configuration of the entire high frequency device 5. FIG. 17 illustrates the equivalent circuit thereof. The high frequency device 5 includes a lowpass filter LPF as a device. The lowpass filter LPF is composed of the first inductive device L1 connected in series with a signal line and the first capacitive device C1 and the second capacitive device C2 connected from the signal line to the ground level. Both the first capacitive device C1 and the second capacitive device C2 are composed of the wiring layers 15b and 15c.

In this embodiment, a depression 55 is provided in the position opposed to the first inductive device L1. The effect by the depression 55 is similar to that of the foregoing embodiments as well. The order of the lowpass filter LPF is not limited as in the case of the foregoing highpass filter HPF.

Sixth Embodiment

Figure 18:
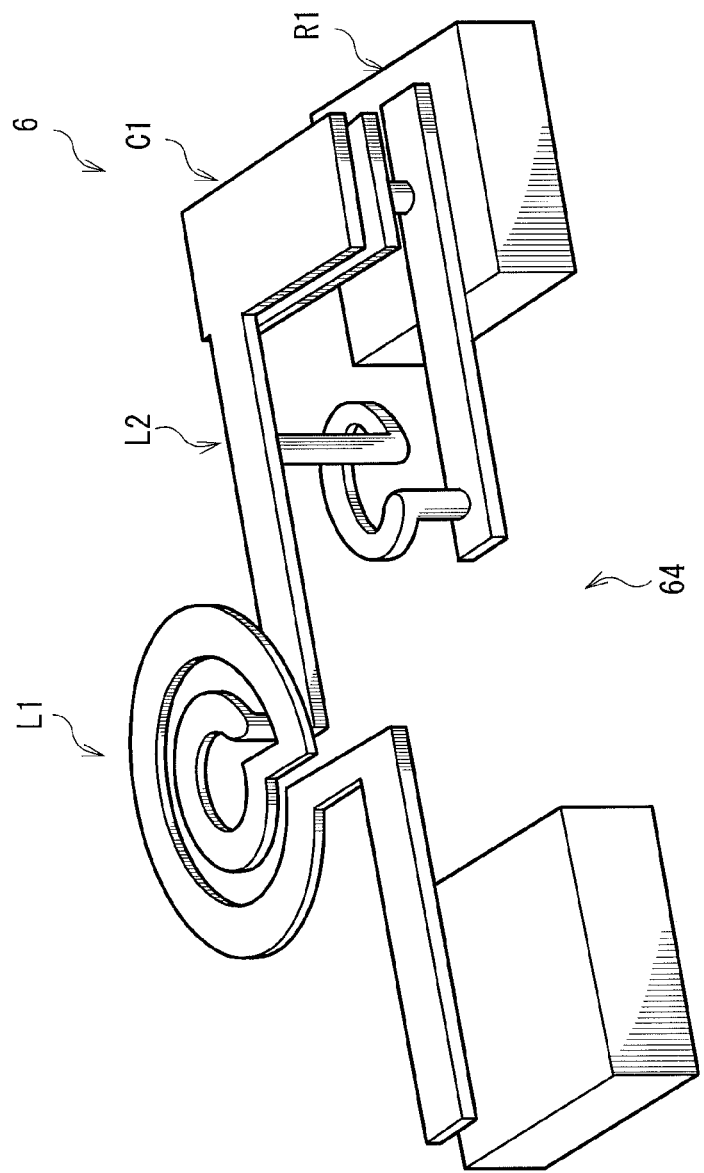
FIG. 18 is a perspective view of a main body section of a high frequency device according to a sixth embodiment of the invention.
Figure 19:
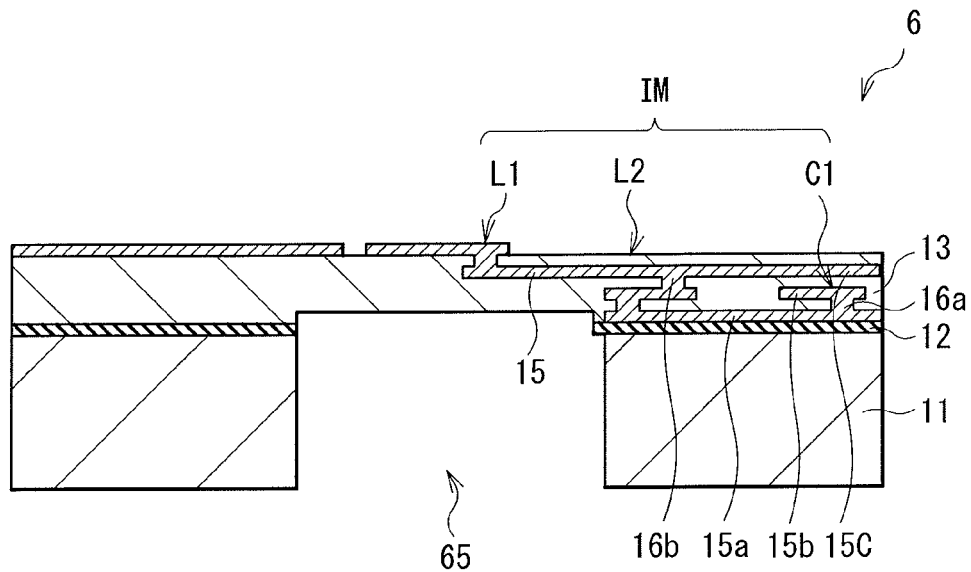
FIG. 19 is a cross sectional structural view of the high frequency device.
Figure 20:
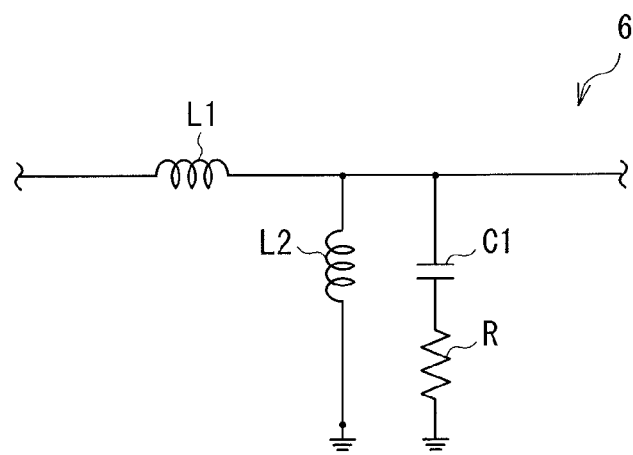
FIG. 20 is an equivalent circuit diagram of the high frequency device.

FIG. 18 illustrates a device main body of a high frequency device 6 according to a sixth embodiment of the invention. FIG. 19 illustrates a cross sectional structure of the entire high frequency device 6, and FIG. 20 illustrates the equivalent circuit thereof. The high frequency device 6 includes an impedance matching circuit IM. The impedance matching circuit IM is composed of the first inductive device L1 connected in series with a signal line, the second inductive device L2 connected from the signal line to the ground level, a series circuit of the capacitive device C1 and a resistive device R connected in parallel with the second inductive device L2. The capacitive device C1 is composed of the wiring layers 15b and 15c. The resistive device R is composed of the wiring layer 15a. The wiring layer 15a is a polysilicon wiring in which phosphorus doped amount is controlled to have a desired specific resistance. The resistance value of the wiring layer 15a is determined by the specific resistance and the length of the wiring layer 15a. To obtain a high resistance value, the wiring is thinned to obtain a meander state to decrease the foot print.

In this embodiment, a common depression 64 is provided in a position opposed to the first dielectric device L1 and the second inductive device L2. The action and the effect are similar to those of the foregoing embodiments.

As described above, the high frequency device of the invention is able to be applied not only to the filter circuit, but also to various circuits.

Figure 21:
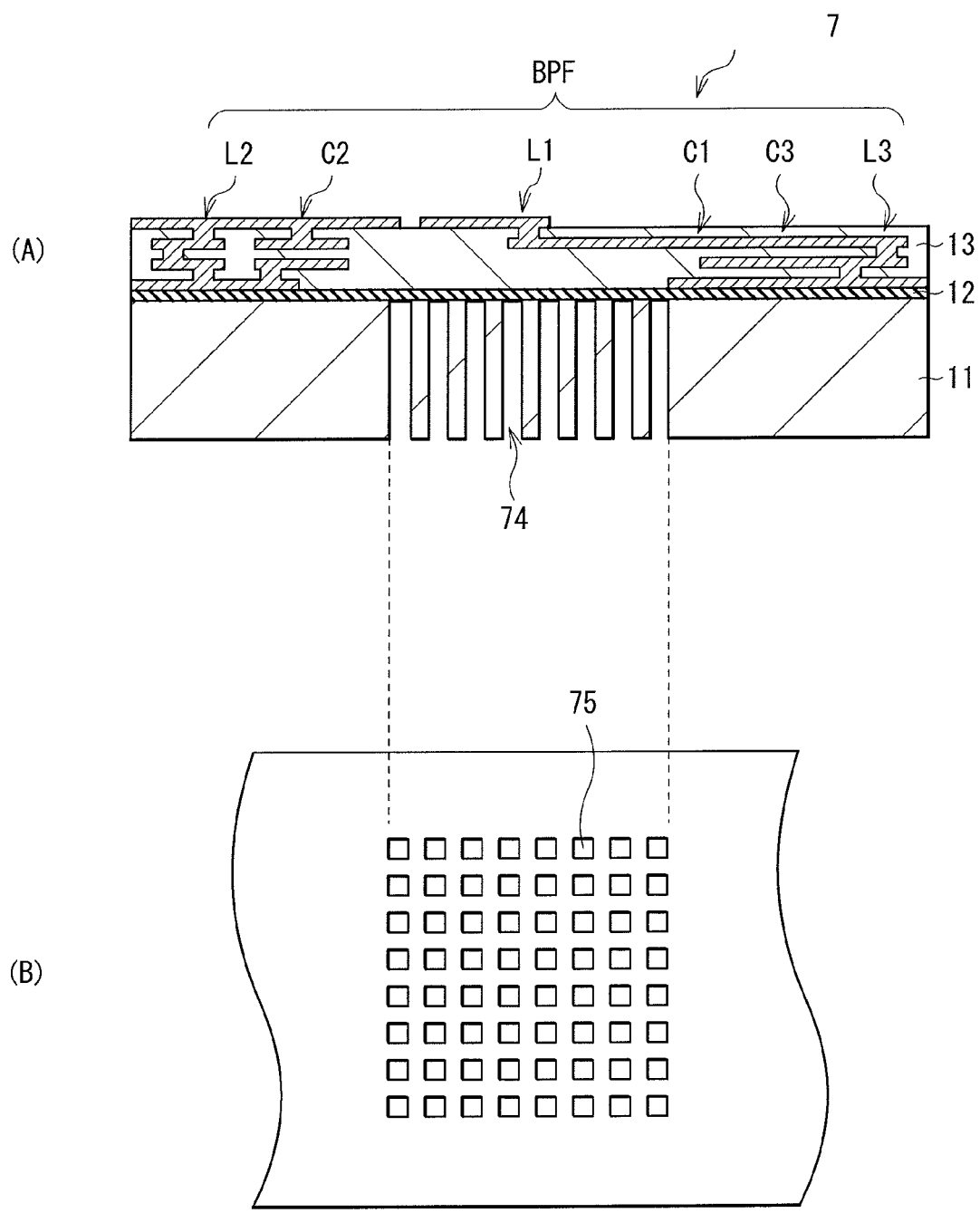
FIG. 21 is a view illustrating a modified example of a depression pattern.

While the invention has been described with reference to the first to the sixth embodiments, the invention is not limited to the foregoing embodiments, and various modifications may be made. For example, the depression provided in the substrate 11 is not necessarily a gap as a whole. For example, as a depression 74 illustrated in FIGS. 21A and 21B, the depression may have a certain pattern such as a mesh shape. The removal region of the substrate 11 and the size thereof may be an area and a depth with which sufficient effect is able to be obtained in terms of satisfying requirements regarding electric characteristics of the device, in particular in terms of satisfying reduction target of earth capacity and dielectric loss.

The present application contains subject matter related to that disclosed in Japanese Priority Patent Application JP 2009-184674 filed in the Japan Patent Office on Aug. 7, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A high frequency device comprising:
   a substrate;
   a dielectric layer over the substrate; and
   a plurality of electronic devices in or on or both in and on the dielectric layer, the plurality of electronic devices forming a filter circuit,
   wherein,
   the filter circuit includes at least a first inductive device,
   the substrate has at least a first depression, the first depression penetrating all the way through the substrate in a thickness direction of the substrate, and
   the first depression is selectively provided in the substrate so as to be positioned opposite the first inductive device in the filter circuit.

2. The high frequency device according to claim 1, wherein the substrate is a semiconductor substrate or a dielectric substrate.

3. The high frequency device according to claim 2, wherein the substrate is a silicon substrate.

4. The high frequency device according to claim 1, wherein the filter circuit includes one or more capacitive devices.

5. The high frequency device according to claim 1, wherein an insulating layer is provided between the substrate and the dielectric layer.

6. The high frequency device according to claim 5, wherein the first depression further extends through the insulating layer and a part of the dielectric layer.

7. The high frequency device according to claim 1, wherein:
   the filter circuit includes multiple inductive devices including the first inductive device,
   the substrate has multiple depressions including the first depression, each depression penetrating all the way through the substrate in the thickness direction of the substrate, and
   each of the depressions is selectively provided in the substrate so as to be positioned opposite a respective one of the inductive devices in the filter circuit.

8. The high frequency device according to claim 7, wherein the filter circuit is a bandpass filter circuit, the bandpass filter circuit including the first inductive device, a second inductive device, a third inductive device, and three capacitive devices.

9. The high frequency device according to claim 1, wherein the filter circuit is a bandpass filter circuit.

10. The high frequency device according to claim 9, wherein the bandpass filter circuit includes the first inductive device, a second inductive device, a third inductive device, and three capacitive devices.

11. The high frequency device according to claim 1, wherein the filter circuit is a low-pass filter circuit.

12. The high frequency device according to claim 1, wherein the filter circuit is a high-pass filter circuit.

* * * * *